United States Patent

Mitsumori et al.

(10) Patent No.: US 6,717,435 B1
(45) Date of Patent: Apr. 6, 2004

(54) PROGRAMMABLE LOGIC DEVICE AND PROGRAMMING METHOD

(75) Inventors: Toshimasa Mitsumori, Moriguchi (JP); Takuya Sayama, Kusatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/130,850

(22) PCT Filed: Nov. 14, 2000

(86) PCT No.: PCT/JP00/08032

§ 371 (c)(1),
(2), (4) Date: May 23, 2002

(87) PCT Pub. No.: WO01/39376

PCT Pub. Date: May 31, 2001

(30) Foreign Application Priority Data

Nov. 26, 1999 (JP) ............................................ 11/336348

(51) Int. Cl.[7] ............................................ H03K 19/177
(52) U.S. Cl. ............................................ 326/38; 326/41
(58) Field of Search ............................ 326/37–41, 30

(56) References Cited

U.S. PATENT DOCUMENTS

| | | | |
|---|---|---|---|
| 4,870,302 A | 9/1989 | Freeman | |
| 5,317,211 A | 5/1994 | Tang et al. | |
| 5,640,107 A | 6/1997 | Kruse | |
| 5,770,951 A | * 6/1998 | Cheung et al. | 326/38 |
| 5,811,987 A | * 9/1998 | Ashmore et al. | 326/39 |
| 6,507,211 B1 | * 1/2003 | Schultz et al. | 326/37 |

FOREIGN PATENT DOCUMENTS

| | | | |
|---|---|---|---|
| JP | Hei 8-307246 | * | 11/1996 |
| JP | 8-307246 A | | 11/1996 |
| JP | 11-74360 A | | 3/1999 |
| JP | Hei 11-74360 | * | 3/1999 |
| JP | 11-225063 A | | 8/1999 |
| JP | 11-274915 A | | 10/1999 |

* cited by examiner

Primary Examiner—Vibol Tan
(74) Attorney, Agent, or Firm—McDermott, Will & Emery

(57) ABSTRACT

Pin setting data for defining initial states of external pins of a programmable logic device (PLD) is transferred to the PLD to set all the external pins before logic setting data for the PLD is transferred from memory, thereby preventing an unstable state of the PLD from propagating to logic circuits adjacent to the PLD. The logic setting data is divided into minimum logic setting data for defining functions required for a stable operation of a system and full logic setting data for defining all functions of the PLD, including functions other than the functions required for a stable operation of the system, and the former is transferred before the latter to reduce a period in which the PLD is unstable during the startup of the system, thereby avoiding instability during the system startup when the PLD is incorporated into an existing system.

2 Claims, 4 Drawing Sheets

PROGRAMMABLE LOGIC DEVICE AND PROGRAMMING METHOD

TECHNICAL FIELD

The present invention relates to a programmable logic device (PLD) and a programming method thereof

BACKGROUND ART

Today, PLDs of which the circuit configuration can be programmed at will are widely used. Program data is stored in a memory area within the PLD or external memory. The program data is transferred to an internal logic circuit to provide function settings of the PLD when the PLD is powered up or reset.

An example of the PLD is described in U.S. Pat. No. 4,870,302 in which configuration of its internal logic circuits (including wiring) can be programmed at will.

The first state of a prior-art PLD is the initial state during power-up, the second state is a program data transfer state, and the third state is a steady state. The states of the external pins and internal circuit of the PLD are unstable until the second state (transfer state) is finished. The states of the external pins and internal logic circuit do not become stable until the PLD enters a steady state after all program data is transferred to it.

The larger the size of the PLD circuit, the longer the period of the second state (transfer state) and therefore the longer a period during which the states of the external pins and internal logic circuit are unstable. In the prior art, the unstable state propagates to logic circuits adjacent to the PLD, decreasing the stability of the entire system. Especially in a configuration in which the PLD is connected to a bus within an electronic circuit system such as a personal computer, the entire system can be initialized only after the state of the PLD becomes stable during the startup of the system. Therefore it is difficult to connect the PLD to the bus in the system that has an existing, predefined startup sequence.

To avoid the above-described unstable state, a transceiver may be provided between the PLD and a logic circuit to prohibit the propagation of the unstable state. However, this approach has problems that connection delay time increases as the number of components increases, and the logic circuit cannot reference the state of the PLD until the state of the PLD becomes stable.

DISCLOSURE OF THE INVENTION

The present invention has been made in the light of the above-described problems and it is an object of the present invention to reduce the period of time in which the state of a PLD is unstable after system startup.

To solve the problems, according to the present invention, program data is divided into a pin setting data block for defining an initial state of each of a plurality of external pins and a logic setting data block for defining functions of internal logic circuits, and a PLD receives the pin setting data block before the logic setting data block. This allows the states of the external pins to become stable earlier during system startup.

According to the present invention, the PLD receives a minimum logic setting data block for defining functions (functions required for a stable operation of the system) of some of its internal logic circuits required for system startup before receiving a full logic setting data block for defining functions of all of its internal logic circuits. This allows logic circuits adjacent to the PLD to reference the state of the PLD earlier during system startup.

BEST MODE FOR EMBODYING THE INVENTION

Figure 1:
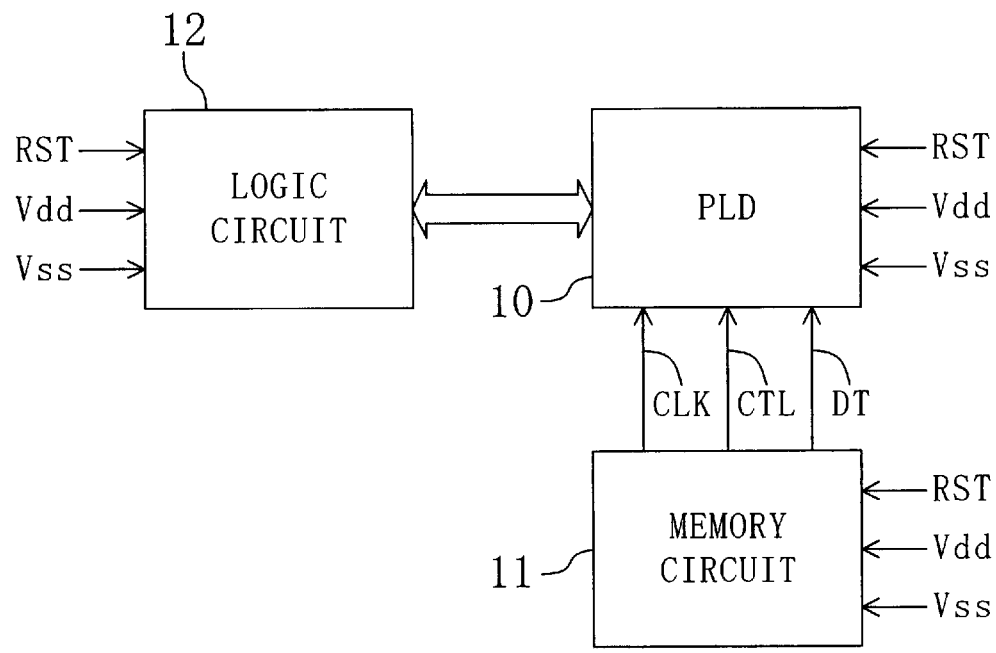
FIG. 1 is a block diagram showing an exemplary configuration of a system using a PLD according to the present invention.

FIG. 1 shows an exemplary configuration of a system using a PLD according to the present invention. The system in FIG. 1 includes a PLD 10, a memory circuit 11, and a logic circuit 12, each of which receives power supply voltages Vdd and Vss and a reset (RST) signal. The RST signal stays active (high) for a predetermined period of time during the power-up of the system. The memory circuit 11 contains (for example 1 megabit of) rewritable, nonvolatile memory for storing program data to be programmed in the PLD 10, a clock generator, and a unit for state control and provides a clock (CLK) signal, a control (CTL) signal, and a data (DT) signal to the PLD 10. The PLD 10 receives the DT signal representing the program data in synchronization with the CLK signal while the CTL signal remains active (low). The logic circuit 12, which includes a microprocessor for example, accomplishes a predetermined system function in cooperation with the programmed PLD 10.

Figure 2:
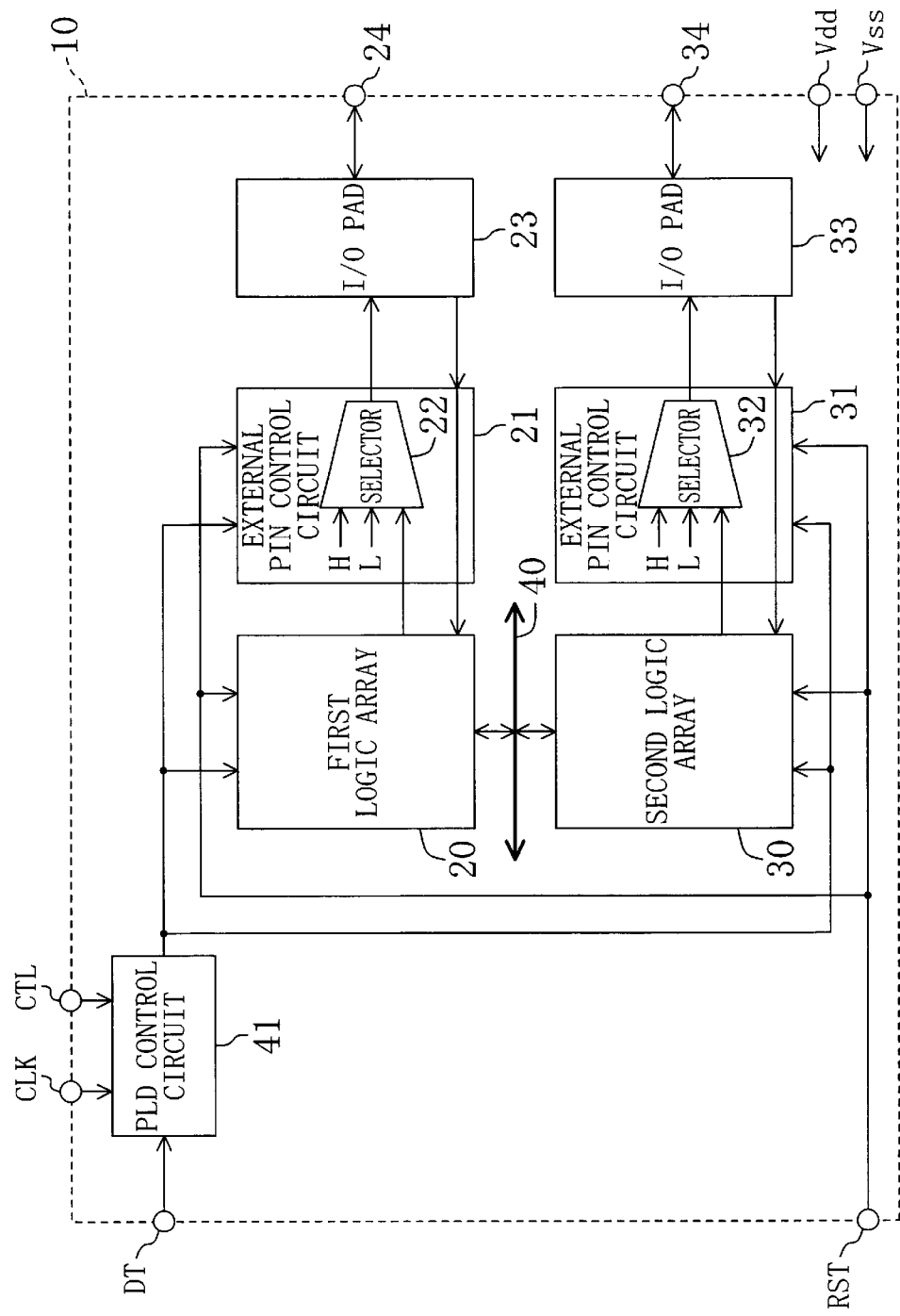
FIG. 2 is a block diagram showing an exemplary internal configuration of the PLD shown in FIG. 1.

FIG. 2 shows an exemplary internal configuration of the PLD 10 shown in FIG. 1. While the PLD 10 in practice contains a large number of logic arrays (programmable internal logic circuit units), only first and second logic arrays 20, 30 are shown in FIG. 2 for simplicity. While the PLD 10 has a large number of external pins (for example 240 pins) for connecting the PLD 10 with the logic circuit 12, only two external pins 24, 34 are shown in FIG. 2 for simplicity. The first logic array 20 is connected to the external pin 24 through an external pin control circuit 21 containing a selector 22 and through an I/O pad 23. The second logic array 30 is connected to the external pin 34 through an external pin control circuit 31 containing a selector 32 and through an I/O pad 33. The selector 22 selectively communicates a fixed high or low level during system startup and eventually communicates an output from the first logic array 20 to the I/O pad 23 if the external pin 24 is used as an output pin. The selector 32 selectively communicates a fixed high or low level during system startup and eventually communicates an output from the second logic array 30 to the I/O pad 33 if the external pin 34 is used as an output pin. The logic arrays 20, 30 exchange data with each other over a main bus 40. The PLD 10 shown in FIG. 2 further includes a PLD control circuit 41 receiving the CLK signal, CTL signal, and DT signal provided from the memory circuit 11. The PLD control circuit 41 receives the DT signal in synchronization with the CLK signal while the CTL signal stays active (low), and provides program data to the first and second logic arrays 20, 30 and the external pin control circuits 21, 31. Internal circuits in the PLD 10 are initialized by a high RST signal.

Figure 3:
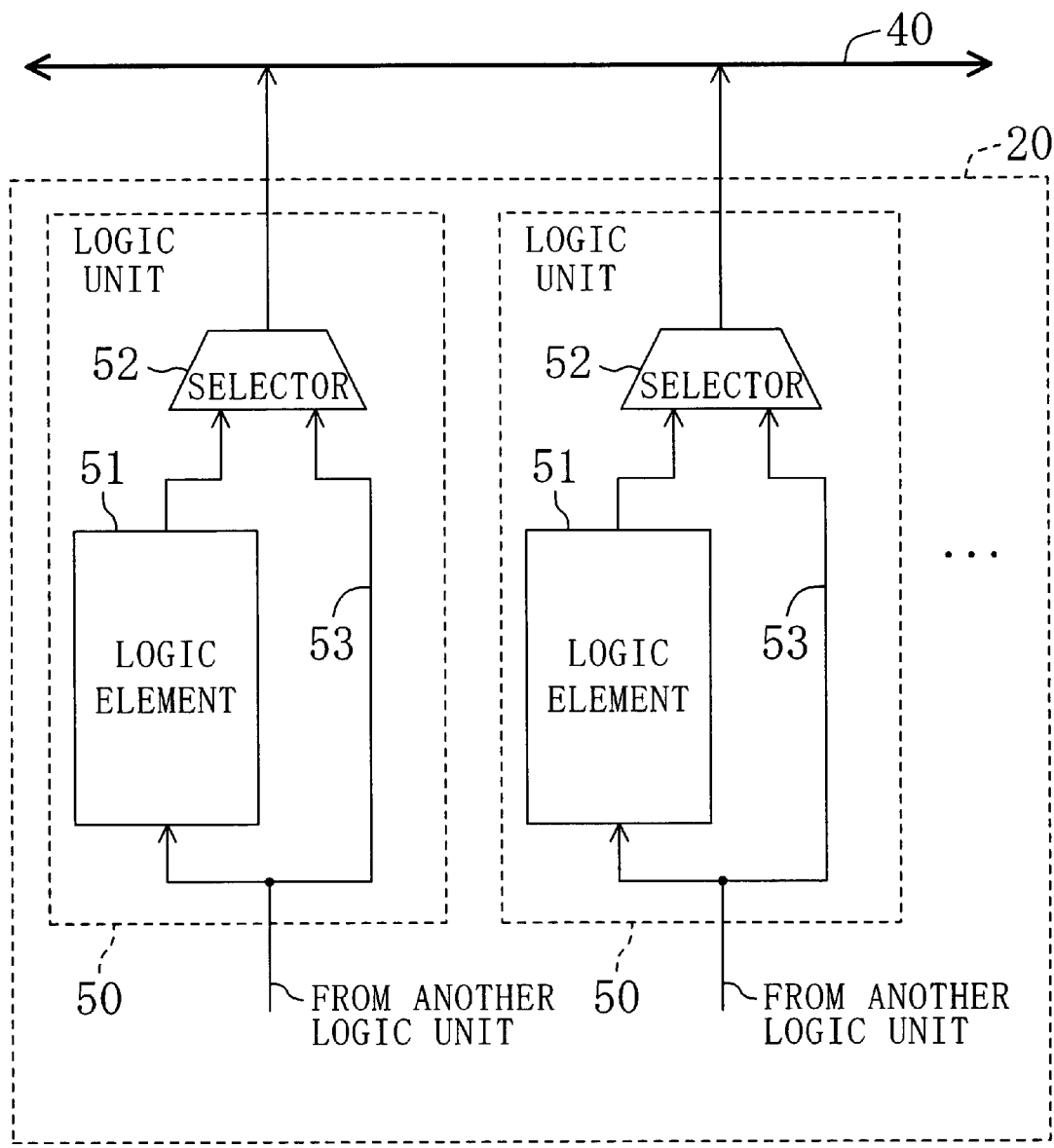
FIG. 3 is a block diagram showing an exemplary internal configuration of a logic array shown in FIG. 2.

FIG. 3 shows an exemplary internal configuration of the first logic array 20 shown in FIG. 2. The logic array 20 includes a large number of logic units 50. Each logic unit 50 comprises a programmable logic element 51 and a selector 52. A first input of the selector 52 communicates an output from the logic element 51 in the logic unit 50 to the main bus 40 and a second input of the selector 52 is connected to a bypass line 53 for communicating an output from the adjacent logic unit directly to the main bus 40. The logic array 20 also has a selector (not shown) for providing a bypass route for transmitting information received from the main bus 40. The second logic array 30 in FIG. 20 also has a similar bypass route.

Figure 4:
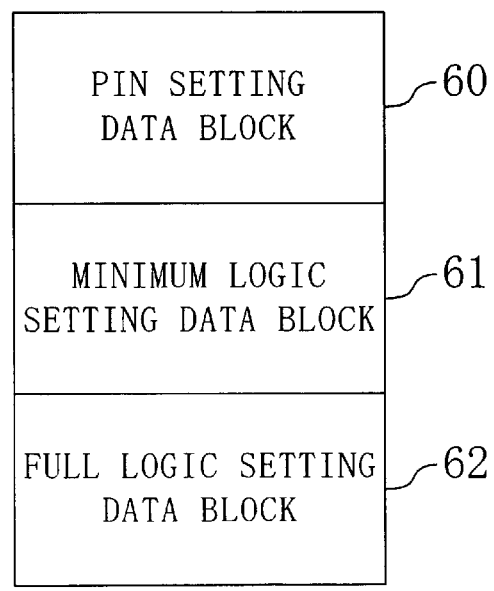
FIG. 4 is a conceptual diagram showing an example of data stored in a memory circuit shown in FIG. 1.

FIG. 4 shows an example of data stored in the memory circuit 11 shown in FIG. 1. As shown in FIG. 4, the program data is divided into a pin setting data block 60 for defining the initial state of the external pins 24, 34, a minimum logic setting data block 61 for defining functions of one or more of the internal logic circuits (the first logic array 20) required during system startup, and a full logic setting data block 62 for defining functions of all the internal logic circuits (the first and second logic arrays 20, 30), in ascending order of address. The program data stored in the minimum logic setting data block 61 is prepared in such a way that the functions of PLD 10 that are required during system startup can be provided through the use of the first logic array 20 alone without the use of the second logic array 30.

Figure 5:
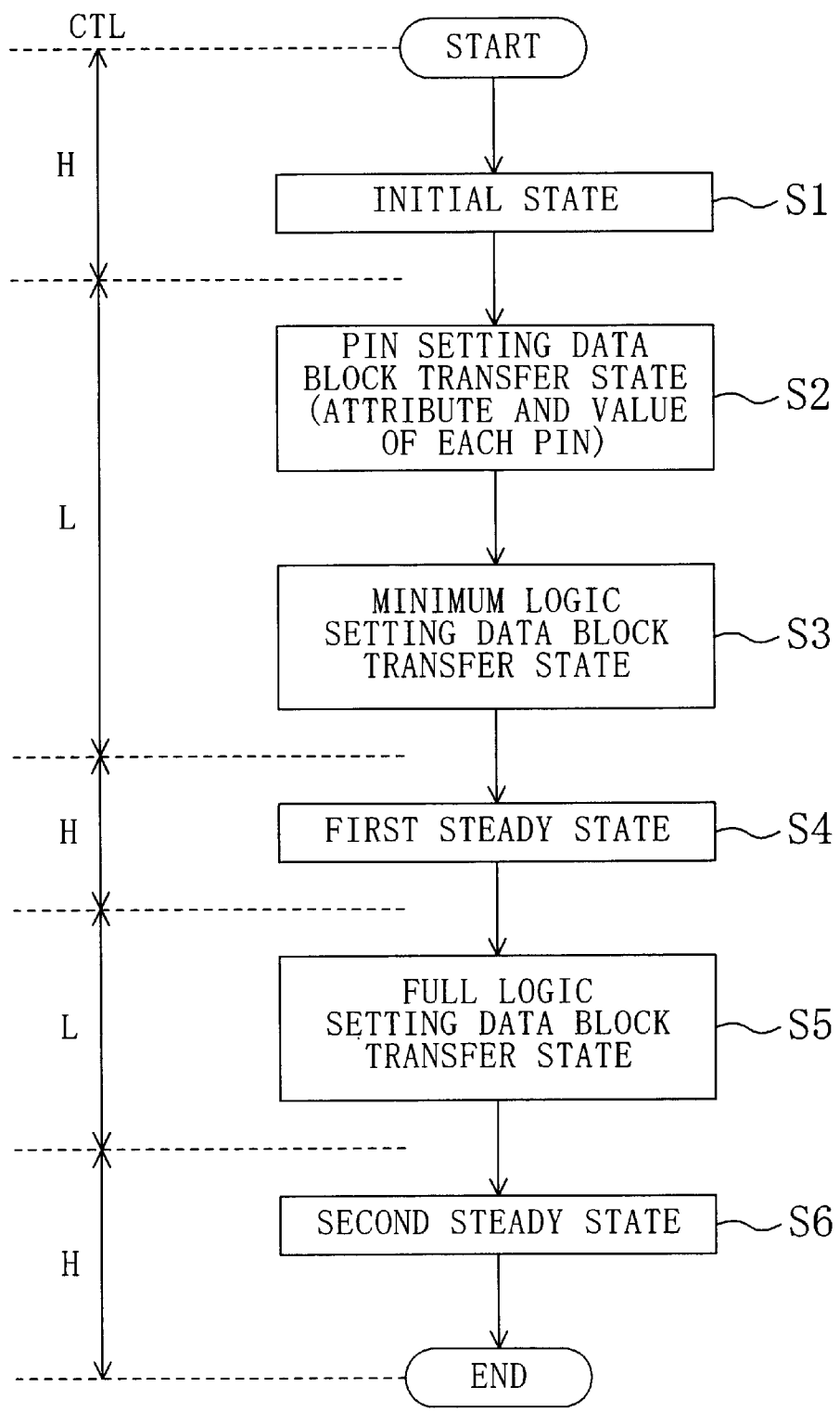
FIG. 5 is a flowchart of a state transition during system startup shown in FIG. 1.

FIG. 5 shows a state transition during startup of the system shown in FIG. 1. The first state S1 is the initial state, the second state S2 is a state in which the pin setting data block 60 is transferred, the third sate S3 is a sate in which the minimum logic setting data block 61 is transferred, the fourth state S4 is a first steady state after the functions required for system startup is programmed in the PLD 10, the fifth state S5 is a state in which the full logic setting data block 62 is transferred, and the sixth state S6 is a second steady state after all the functions of the PLD 10 are programmed in the PLD 10. Each of the states will be described below in the order of occurrence.

During the system in FIG. 1 is powered up, that is, the system is started up, the RST signal remains active (high) for a predetermined period of time. The memory circuit 11 starts to provide the CLK signal in response to the power-up, and hold the CTL signal inactive (high) in response to the high RST signal. This state is the first state S1, that is, the initial state. In the PLD 10, all selectors 52 of each of the first and second logic arrays 20 and 30 select the bypass line 53 in response to the high RST signal. Therefore, all the logic elements 51 are disconnected from the main bus 40. The external pin control circuits 21, 31 set the attribute of all the external pins 24, 34 as an "input" pin and cause all the selectors 22, 32 to select the fixed low input. Alternatively, they may cause all the selectors 22, 32 to select the fixed high input.

When the RST signal becomes inactive (low), the memory circuit 11 changes the CTL signal to active (low) and continues providing the CLK signal while sequentially providing a DT signal concerning the pin setting data block 60 to the PLD 10 in synchronization with the CLK signal. This is the second state S2. In the PLD 10, the PLD control circuit 41 receives the DT signal in synchronization with the CLK signal while monitoring the low CTL signal and provides pin setting data to the external pin control circuits 21, 31. The pin setting data is a set of pin attribute and pin value of each pin. This decides the state of all the external pins 24, 34. In particular, the logical level of an external pin of which the attribute is set as an "output" pin is settled at a predetermined pin value (high or low selected by the selector 22 or 32). Therefore, even if both of the first and second logic arrays 20, 30 are in an unstable (undefined) state, the unstable state does not propagate to the logic circuit 12.

After the states of all the external pins 24, 34 are set, the third state S3 is entered. In the third state S3, the memory circuit 11 sequentially provides a DT signal concerning the minimum logic setting data block 61 to the PLD 10 in synchronization with the CLK signal while holding the CTL signal active (low). In the PLD 10, the PLD control circuit 41 receives the DT signal in synchronization with the CLK signal while monitoring the low CTL signal, and provides the minimum logic setting data to the first logic array 20. This decides the circuit configuration of the first logic array 20 for providing functions required for system startup (functions required for a stable operation of the system). However, the state of the second logic array 30 is still unstable.

After the transfer of the minimum logic setting data block 61 is completed, the memory circuit 11 first forces the CTL signal back to inactive (high). This state is the fourth state S4, that is, the first steady state. The first logic array 20, of which the functions have been already defined, can access the external pin 34 over a bypass route in the second logic array 30. The logic circuit 12 shown in FIG. 1 can receive information from the PLD 10 in the first steady state through the external pins 24, 34. Therefore, the logic circuit 12 can be initialized according to the state of the PLD 10.

When a stage in which the system uses all the functions of the PLD 10 is reached, the memory circuit 11 forces the. CTL signal back to active (low), then sequentially provides to the PLD 10 a DT signal concerning the full logic setting data block 62 in synchronization with the CLK signal. This state is the fifth state S5. In the PLD 10, the PLD control circuit 41 receives the DT signal in synchronization with the CLK signal while monitoring the low CTL signal, and provides the full logical setting data to the first and second logic arrays 20, 30. This decides the final circuit configuration of the first and second logic arrays 20, 30.

After the completion of the transfer of the full logic setting data block 62, the memory circuit 11 forces the CTL signal back to inactive (high). This is the sixth state S6, that is, the second steady state. Then, the logic circuit 12 and the programmed PLD 10 cooperate to accomplish predetermined system functions.

As described above, the transfer of the pin setting data block 60 is completed in the earlier, second state S2 in the system including the PLD 10 of the present invention, therefore a time period in which the PLD 10 is unstable during system startup is reduced. In addition, the transfer of the minimum logic setting data block 61 preceding the transfer of the full logic setting data block 62 is completed in the third state S3, therefore the logic circuit 12 can reference the state of the PLD 10 in an early stage during system startup. The amount of data in the pin setting data block 60 may vary depending on the number of external pins of the PLD 10 and the amount of data in the minimum logic setting data block 61 may vary depending on the size of the internal logic circuit and system specifications of the PLD 10.

INDUSTRIAL APPLICABILITY

According to the present invention, the PLD receives the pin setting data block before receiving the logic setting data block, thereby reducing a period in which the state of the PLD is unstable during system startup.

According to the present invention, the PLD receives the minimum logic setting data block before receiving the full logic setting data block, therefore logic circuits adjacent to the PLD can reference the state of the PLD in an early stage during system startup. In particular, a device recognition system can references the state of the PLD in an early stage in a configuration in which the PLD is connected onto a bus within an electronic circuit system such as a personal computer.

What is claim is:

1. A method for programming a programmable logic device (PLD), comprising the steps of:

transferring to said PLD a minimum logic setting data block for defining functions of one or more of internal logic circuits of said PLD, said one or more of internal logic circuits being required in starting up a system containing said PLD;

entering a steady state where a logic circuit in said system can receive information from said PLD after the completion of the transfer of said minimum logic setting data block; and transferring to said PLD a full logic setting data block for defining functions of all the internal logic circuits of said PLD with the temporary termination of said steady state.

2. A method for programming a programmable logic device (PLD), comprising the steps of:

transferring a pin setting data block for defining an initial state of each of a plurality of external pins of said PLD to said PLD;

transferring to said PLD a minimum logic setting data block for defining functions of one or more of internal logic circuits of said PLD after the completion of the transfer of said pin setting data block, said one or more of internal logic circuits being required in starting up a system containing said PLD;

entering a steady state where a logic circuit in said system can receive information from said PLD after the completion of the transfer of said minimum logic setting data block; and transferring to said PLD a full logic setting data block for defining functions of all the internal logic circuits of said PLD with the temporary termination of said steady state.

* * * * *